(12) United States Patent
Chouly

(10) Patent No.: US 6,574,775 B1
(45) Date of Patent: Jun. 3, 2003

(54) ITERATIVE DECODING FOR BINARY BLOCK CODES

(75) Inventor: Antoine Chouly, Paris (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/248,138

(22) Filed: Feb. 10, 1999

(30) Foreign Application Priority Data

Feb. 17, 1998 (FR) .............................................. 9801905

(51) Int. Cl.[7] ................................................ G06F 11/00
(52) U.S. Cl. ........................ 714/800; 714/777; 714/755
(58) Field of Search ................................. 714/800, 799, 714/801, 802, 803, 804, 805, 778, 780, 792, 763, 757, 777, 755, 795, 794; 375/262, 264, 298, 265, 282, 291, 341, 329, 286; 341/94; 348/466; 370/207, 478; 710/2

(56) References Cited

U.S. PATENT DOCUMENTS

| | | | | |
|---|---|---|---|---|
| 4,340,933 A | * | 7/1982 | Miu et al. ...................... | 714/53 |
| 4,933,956 A | * | 6/1990 | Forney, Jr. ................... | 375/341 |
| 5,416,804 A | * | 5/1995 | Khaled et al. ............... | 375/341 |
| 5,481,553 A | * | 1/1996 | Suzuki et al. ................ | 714/800 |
| 5,515,388 A | * | 5/1996 | Yagasaki ...................... | 714/800 |
| 5,754,563 A | * | 5/1998 | White .......................... | 714/757 |

OTHER PUBLICATIONS

Pyndiah et al., Near Optimal Decoding of Product Codes, Nov., 1994 IEEE, pp. 339–343, vol. 1.*
Pyndiah, Near Optimal Decoding of Product Codes: Block Turbo Codes, Aug., 1998 IEEE, pp. 1003–1010, vol. 46.*
Pyndiah et al., "Near Optimum Decoding of Product Codes", Proceedings of the Global Telecommunications Conference, vol. 1, Nov. 28, 1994—Dec. 2, 1994, pp 339–343.
"A Class of Algorithms for Decoding Block Codes with Channel Measurement Information", David Chase, IEEE Transactions on Information Theory, vol. IT–18, No. 1, Jan. 1972.
Related Cases/Technology Report.

* cited by examiner

Primary Examiner—Albert Decady
Assistant Examiner—Guy Lamarre
(74) Attorney, Agent, or Firm—Laurie E. Gathman

(57) ABSTRACT

An iterative decoder and decoding method for decoding a binary block code defined by a parity check matrix. The parity matrix is processed several times row-by-row so that each iteration of the decoding corresponds to the decoding of the code defined by a row of the matrix for received data. For decoding an extended code, each row defines two separate codes which are decoded with each iteration.

12 Claims, 5 Drawing Sheets

ITERATIVE DECODING FOR BINARY BLOCK CODES

CROSS-REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

1. Field of the Invention

The invention relates to a digital transmission system comprising at a transmitting end data coding means based on a binary block code defined by a parity check matrix, and at a receiving end decoding means for making decisions on received data.

The invention also relates to a method of decoding previously coded data based on a binary block code defined by a parity check matrix and a decoder for decoding previously coded data based on the binary block code defined by a parity check matrix.

The invention has important applications, notably in the field of digital data transmission.

2. Description of Related Art

The article "A Class of Algorithms for Decoding Block Codes with Channel Measurement Information", written by David Chase and published in IEEE Transactions on Information Theory, Vol. IT-18, no. 1, January 1972, describes a method of decoding binary block codes.

SUMMARY OF THE INVENTION

It is an object of the invention to propose a much simpler method which enables to obtain a performance of the same order.

For this purpose, a digital transmission system according to the invention and as described in the opening paragraph is characterized in that said decoding means are iterative decoding means, each iteration corresponding to the decoding, for received data, of the code or codes defined by a row of the matrix.

Similarly, a decoding method according to the invention and as described in the opening paragraph is characterized in that said method is an iterative decoding method which comprises for each iteration a decoding step, for received data, of the code or codes defined by a row of the matrix.

And a decoder according to the invention and as described in the opening paragraph is characterized in that it comprises iterative decoding means, each iteration corresponding to the decoding, for received data, of the code or codes defined by a row of the matrix.

When said binary block code is an extended code, each row of the matrix defines two separate codes and, advantageously, said iterative decoding means comprise means for processing each of the two codes in parallel.

Finally, in an advantageous embodiment of the invention, said decoding means comprise for the processing of certain iterations at least:

- calculating means for calculating, based on input data, reliability data relating to soft decisions,
- transforming means for calculating transformed data based on said soft decisions so as to normalize the mean value of said reliability data,
- weighting means for calculating weighted sums of said transformed data and received data with a first and a second weight factor, respectively,
- generating means for generating subsequent input data to be re-inserted for the next iteration on the basis of said weighted sums.

BRIEF DESCRIPTION OF THE DRAWINGS

These and other aspects of the invention are apparent from and will be elucidated with reference to the embodiments described hereinafter.

In the drawings.

DESCRIPTION OF PREFERRED EMBODIMENTS

In the following description reference is made to an extended binary block code. For more details about this type of code the reader is referred to, for example, the book by Arnold M. Michelson and Allen H. Levesque entitled "Error control techniques for digital communications", published in the Wiley Intersciences Editions in 1985.

Figure 1:
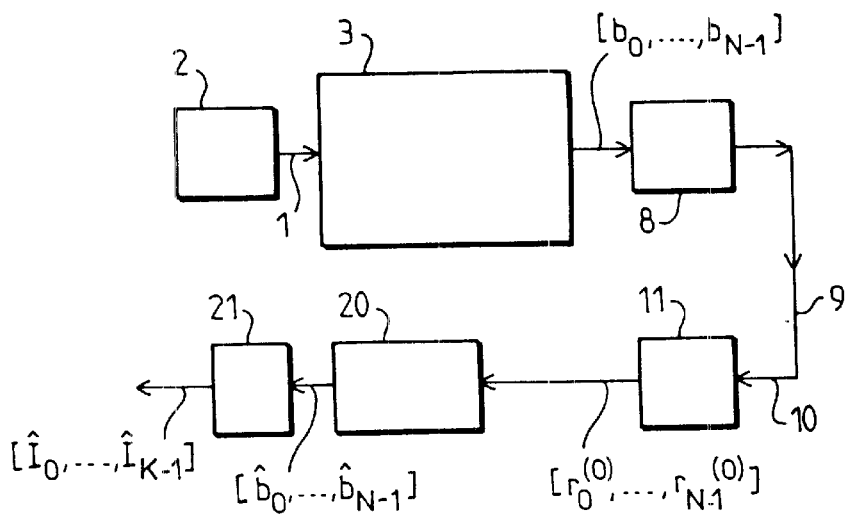
FIG. 1 diagrammatically shows a transmission system according to the invention.

The code used is a code of length N and dimension K. Thus, as indicated in FIG. 1, data to be protected coming from a source 2 is divided into words of K bits $[I_0, \ldots, I_{K-1}]$ which are processed by coding means 3. These coding means generate for each information word a code word of N bits $[b_0, \ldots, b_{N-1}]$. The number of redundancy bits of the code is thus (N−K). Modulation means 8 assign the code words produced on the output of the coding means 3 to symbols of a constellation. These symbols are transmitted over a channel 9. In the example described here, the constellation used is a QPSK constellation, so that decoding consists of making a decision between two possible values (+1 and −1) for each symbol received in the quadrature and the in-phase channel.

The invention can be applied to other types of constellation, notably to a BPSK constellation.

At the receiving end, the received data 10 are processed by customary demodulation means 11. The real symbols $[r_0^{(0)}, \ldots, r_{N-1}^{(0)}]$ produced on the output of the demodulation means 11 are applied to iterative decoding means 20 which deliver an estimation $[\hat{b}_0, \ldots, \hat{b}_{N-1}]$ of the code word that has been transmitted. These N estimation bits are then transmitted to extraction means 21 which deliver an estimation $[\hat{I}_0, \ldots, \hat{I}_{K-1}]$ of the transmitted data word.

Let $H=[h_{ji}]$ be the parity check matrix that defines the code used. This matrix is a matrix having dimension (N−K).N whose elements $h_{ji}$ have a 0 or 1-value.

The matrix enables to define a first series (1) of parity check equations:

$$Hb^T = [0] \quad (1)$$

where $b^T$ is the column vector formed by the transpose of the code word $[b_0, \ldots, b_{N-1}]$. The equations (1) may also be written for $j=0, \ldots, N-K-1$ as:

$$\sum_{i=0}^{N-1} h_{ji} b_i = 0$$

or also:

$$\sum_{i \in S_j} b_i = 0$$

where $\Sigma$ designates the modulo-2 sum and $S_j$ is the set of indices lying between $\{0, \ldots, N-1\}$, so that $h_{ji}=1$. Each of these equations can be regarded as a simple parity code denoted $C_j$ applied to the word $[b_0, \ldots, b_{N-1}]$.

When the code used is an extended code, the overall parity of the bits of the code word is satisfied as a result, the last row of the matrix ($j=N-K-1$) is a row of 1). The relation (2) is thus also verified:

$$b_0 \oplus b_1 \oplus b_2 \oplus \ldots \oplus b_{N-1} = 0 \quad (2)$$

(the sign $\oplus$ indicates the modulo-2 sum).

In this case, the matrix H defines a second series of equations (3) for $j=0, \ldots, N-1$ which are derived from the relations (1) and (2):

$$\sum_{i \in \overline{S}_j} b_i = 0$$

where $\overline{S}_j$ is the set of indices lying between $\{0, \ldots, N-1\}$, so that $h_{ji}=0$. Just like the relations (1), each of these equations can be regarded as a simple parity code denoted $C'_j$ applied to the word $[b_0, \ldots, b_{N-1}]$.

According to the invention, the decoding is an iterative decoding. The principle of iterative decoding (or turbo decoding) was explained at the conference "Near Shannon error correcting coding and decoding: turbo codes" by A. Glavieux et al., IEEE IC-93, pp. 1064–1071, May 1993, for the decoding of concatenated codes. It consists of approaching an optimum decoding by effecting Q iterations of a non-optimum decoding. The Q-1$^{th}$ first iterations consist of generating a soft decision equal to the product of a reliability data about a received symbol and of the decision called hard decision made about this symbol, and inserting this soft decision into the input of the decoding means for the next iteration. The last iteration produces a hard decision.

The invention notably consists of applying this decoding principle to a binary block code. Therefore, each iteration j consists of decoding the code $C_{(j)mod(m)}$, or advantageously the codes $C_{(j)mod(m)}$ and $C'_{(j)mod(m)}$ in parallel when the code is an extended code (when $m=N-K-1$ is the index of the last but one row of the matrix H.) In other words, the parity check matrix is processed row-by-row various times so that, for received symbols $r_i^{(0)}$, each iterative decoding iteration corresponds to the decoding of the code $C_{(j)mod(m)}$ or codes $C_{(j)mod(m)}$ and $C'_{(j)mod(m)}$ defined by the row (j) modulo-(m) of the matrix.

In the following description, the code is considered to be an extended code.

The first iteration (j=0) is applied to symbols received from the channel $[r_0^{(0)}, \ldots, r_{N-1}^{(0)}]$. In a general way, the iteration j is applied to a block of input data $[r_0^{(j)}, \ldots, r_{N-1}^{(j)}]$ and it produces, after decoding the codes $C_{(j)mod(m)}$ and $C'_{(j)mod(m)}$, a block of soft decisions $[r'_0^{(j)}, \ldots, r'_{N-1}^{(j)}]$. In an advantageous embodiment of the invention, another block $[r''_0^{(j)}, \ldots, r''_{N-1}^{(j)}]$ is derived from this block of soft decisions. This other block constitutes the block of subsequent input data for the next iteration (j+1), so that $$[r_0^{(j+1)}, \ldots, r_{N-1}^{(j+1)}] = [r''_0^{(j)}, \ldots, r''_{N-1}^{(j)}].$$

Figure 2:
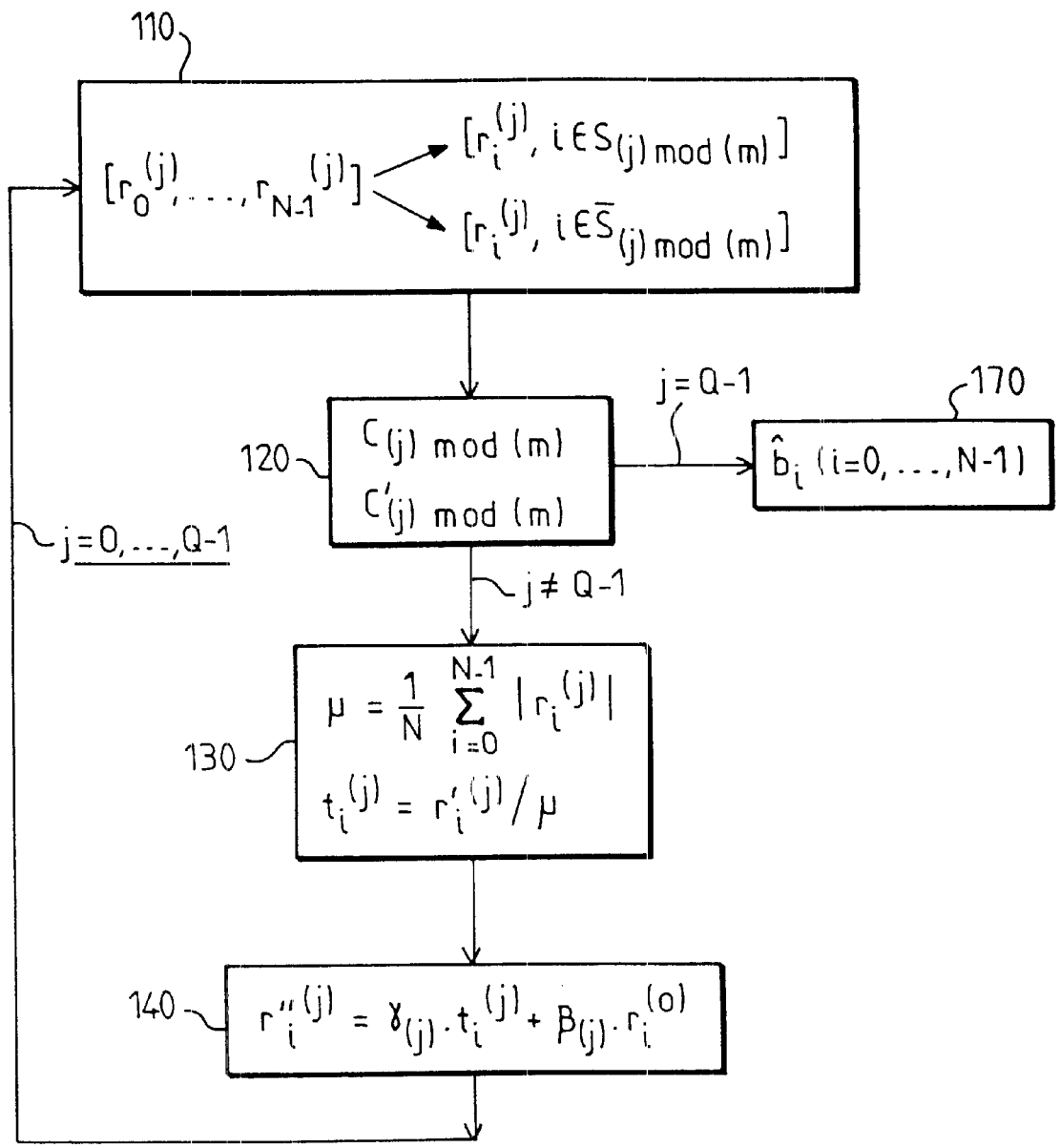
FIG. 2 represents the various steps of a decoding method according to the invention.

This decoding method is summarized in FIG. 2. It comprises the following steps for each iteration j:

step 110: subdivision of the block of input data $[r_0^{(j)}, \ldots, r_{N-1}^{(j)}]$ into two groups, the one corresponding to the indices lying in $S_{(j)mod(m)}$, and the other corresponding to indices lying in $\overline{S}_{(j)mod(m)}$.

step 120: decoding of $C_{(j)mod(m)}$ and $C'_{(j)mod(m)}$ applied to $[r_i^{(j)}, i \in S_{(j)mod(m)}]$ and to $[r_i^{(j)}, i \in \overline{S}_{(j)mod(m)}]$, respectively.

step 130: normalization of the soft decisions $r'_i^{(j)}$:

$$t_i^{(j)} = r_i'^{(j)}/\mu \text{ with } \mu = \frac{1}{N}\sum_{i=0}^{N-1} |r_i'^{(j)}|$$

This normalization enables to take into account that the data $t_i^{(j)}$ are theoretically distributed around the values +1 and −1 in accordance with a Gaussian distribution.

step 140: weighting of the data $t_i^{(j)}$ with the symbols received from the channel $r_i^{(0)}$: $r''_i^{(j)} = \gamma_{(j)} \cdot t_i^{(j)} + \beta_{(j)} \cdot r_i^{(0)}$ where $\gamma_{(j)}$ and $\beta_{(j)}$ are the first and second weight factors. In an advantageous way, there is selected $\beta_{(j)} = 1 - \gamma_{(j)}$ and $\gamma_{(0)} = 0.5$, $\gamma_{(1)} = 0.7$, $\gamma_{(2)} = 0.9$ and $\gamma_{(j>2)} = 1$. Thus, by reducing the weight of the received symbols in accordance with the iterations, the risk is taken into account that the divergence diminishes with the number of iterations, whereas the error correction increases. At the end of the step 140, the method is resumed at step 110.

Figure 3:
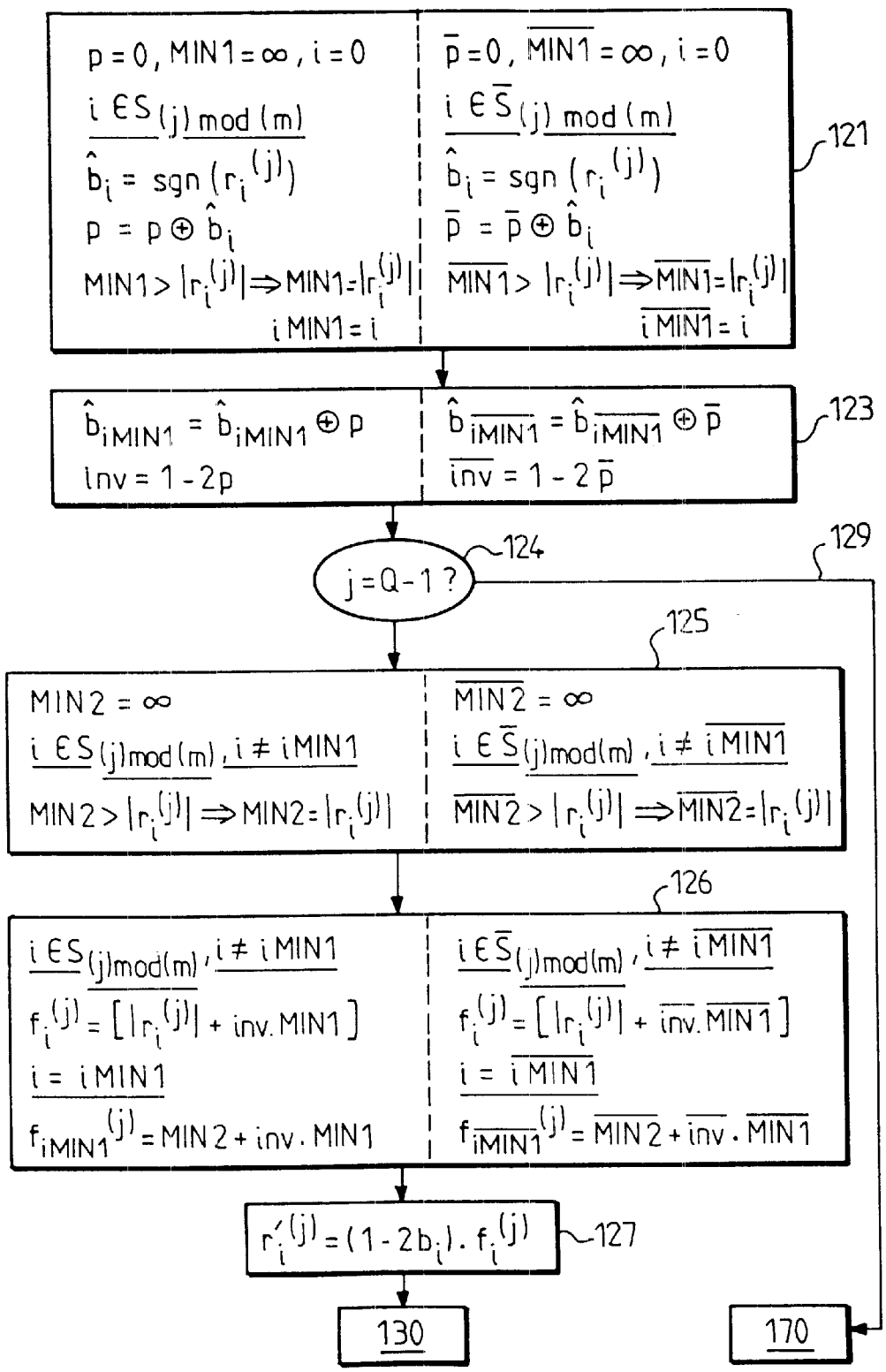
FIG. 3 is a detailed representation of one of the steps of the decoding method shown in FIG. 2.

FIG. 3 shows the second step 120 in detail. This step combines the steps following 120 up to 126 for each of the two decodings $C_{(j)mod(m)}$ and $C'_{(j)mod(m)}$:

step 121: calculation of the parities p and $\overline{p}$ of the symbols $r_i^{(j)}$ to which the decoding is applied (that is, symbols $[r_i^{(j)}, i \in S_{(j)mod(m)}]$ for the decoding of $C_{(j)mod(m)}$ and symbols of $[r_i^{(j)}, i \in \overline{S}_{(j)mod(m)}]$ for the decoding of $C'_{(j)mod(m)}$, and searches in each of its two symbol sets $r_i^{(j)}$ for the less reliable, that is to say, the one nearer to zero (these symbols are called first minimums and denoted MIN1 and $\overline{\text{MIN1}}$, respectively):

initialization: p=0, MIN1=∞ and $\overline{\text{MIN1}}$=∞ for $i \in S_{(j)mod(m)}$
  calculation of $\hat{b}_i = \text{sgn}(r_i^{(j)})$, with sgn(x)=0 if x>0 and 1 if not
  calculation of $p = p \oplus \hat{b}_i$
  if MIN1>$|r_i^{(j)}|$ then MIN1=$|r_i^{(j)}|$ and iMIN1=i and for $i \in \overline{S}_{(j)mod(m)}$,
  calculation of $\hat{b}_i = \text{sgn}(r_i^{(j)})$, with sgn(x)=0 if x>0 and 1 if not
  calculation of $\overline{p} = \overline{p} \oplus \hat{b}_i$
  if $\overline{\text{MIN1}}$>$|r_i^{(j)}|$ then $\overline{\text{MIN1}}$=$|r_i^{(j)}|$ and $\overline{\text{iMIN1}}$=0 step 123: in each of the two sets, correction of the less reliable symbol and calculation of a sign indicator denoted inv and $\overline{\text{inv}}$, respectively:
  $\hat{b}_{iMIN1} = \hat{b}_{iMIN1} \oplus p$ and inv=1−2p
  $\hat{b}_{\overline{iMIN1}} = \hat{b}_{\overline{iMIN1}} \oplus \overline{p}$ and $\overline{\text{inv}}$=1−2$\overline{p}$:

step 124: test j=Q−1 (where Q is the total number of iterations necessary for approaching the optimum decoding). If j=Q−1, the decoding is terminated, which is symbolized in FIG. 3 by an arrow 129 to a box 170 at the end of the method. The hard decisions are formed by the block $\hat{b}_i$(i=0, . . . , N−1). If j≠Q−1, the iteration carries on with the next steps 125, 126 and 127.

step 125: search for the second minimum denoted MIN2:
  initialization: MIN2=∞, and $\overline{\text{MIN2}}$=∞
  for i∈$S_{(j)mod(m)}$ and i≠iMIN1, if MIN2>$|r_i^{(j)}|$, then MIN2=$|r_i^{(j)}|$
  and for i∈$\overline{S}_{(j)mod(m)}$ and i≠i$\overline{\text{MIN1}}$, if $\overline{\text{MIN2}}$>$|r_i^{(j)}|$, then $\overline{\text{MIN2}}$=$|r_i^{(j)}|$ step 126: calculation of the reliability $f_i^{(j)}$ and of the soft decision $r'_i^{(j)}$:
  for i∈$S_{(j)mod(m)}$ and i≠iMIN1, $f_i^{(j)}$=[$|r_i^{(j)}|$+inv.MIN1]
  for i=iMIN1, $f_{iMIN1}^{(j)}$=MIN2+inv.MIN1
  for i∈$\overline{S}_{(j)mod(m)}$ et i≠i$\overline{\text{MIN1}}$, $f_i^{(j)}$=[$|r_i^{(j)}|$+$\overline{\text{inv.MIN1}}$]
  for i=i$\overline{\text{MIN1}}$, $f_{i\overline{\text{MIN1}}}^{(j)}$=$\overline{\text{MIN2}}$+$\overline{\text{inv. MIN1}}$ step 127: for any i varying from 0 to N−1,
  $r'_i^{(j)}$=(1−2$\hat{b}_i$).$f_i^{(j)}$ This reliability calculation is a conventional calculation of which the principle is recalled, for example, in the article "Efficient soft-in-soft-out sub-optimal decoding rule for single parity check codes" published in ELECTRONICS LETTERS of Sep. 11, 1997 (Vol. 33, no. 19).

In practice, it has been found that a number q of iterations of the order of 2m enables to converge to the optimum decoding.

Figure 4:
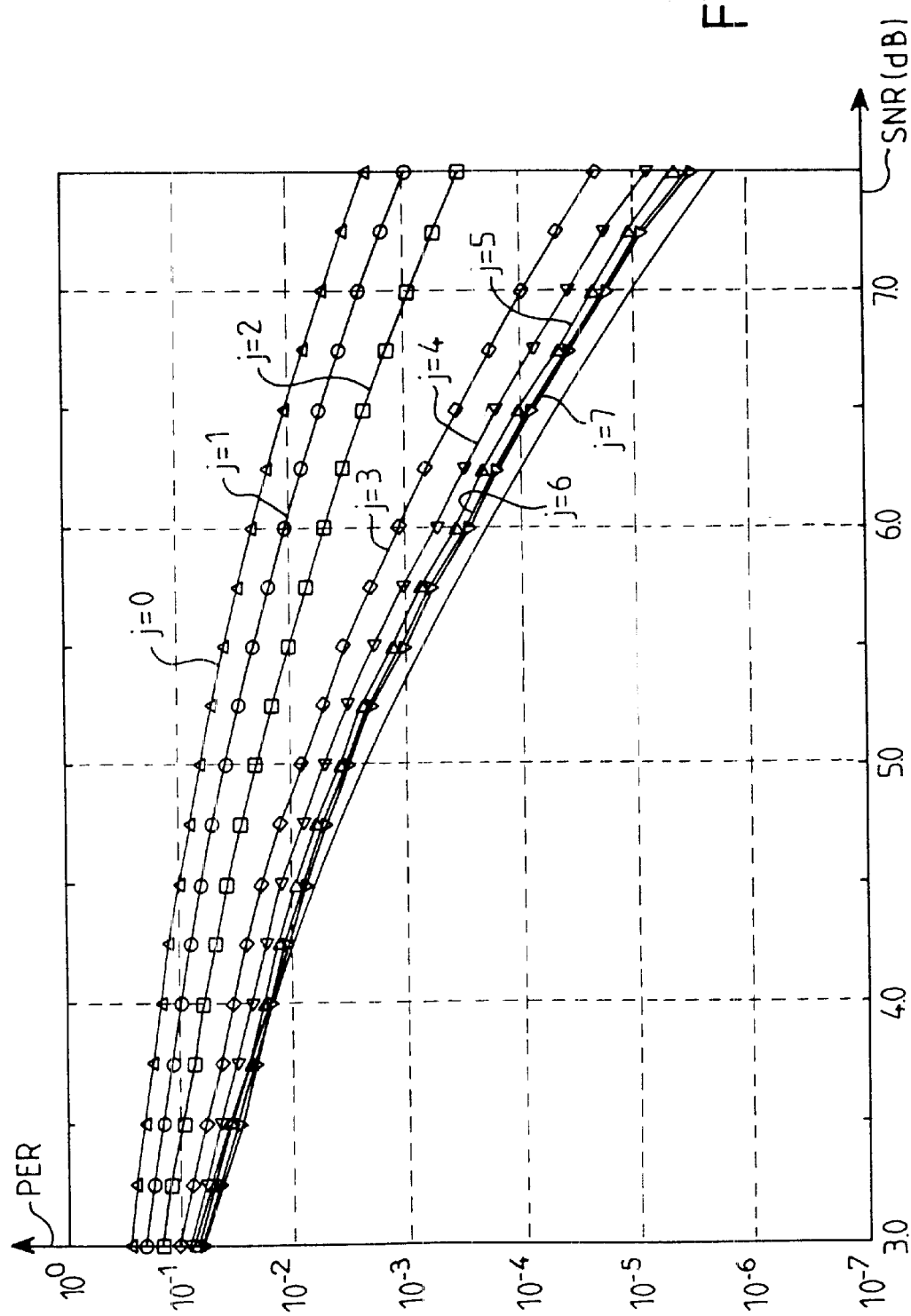
FIG. 4 is a block diagram of a decoder according to the invention.

In FIG. 4 are represented the results obtained (packet error rate PER as a function of the signal-to-noise ratio SNR expressed in dB in accordance with iterations for an extended Hamming code H (16,11) (that is, for N=16, K=11 and m=4).

The curves obtained show that one converges to the optimum decoding from the $7^{th}$ iteration onwards (in the FIGURE, the optimum decoding is represented by an unbroken line without a symbol).

It will be noted that the invention which is applicable to any binary block code gives particularly interesting results in the particular case where this code is a Hamming code.

Figure 5:
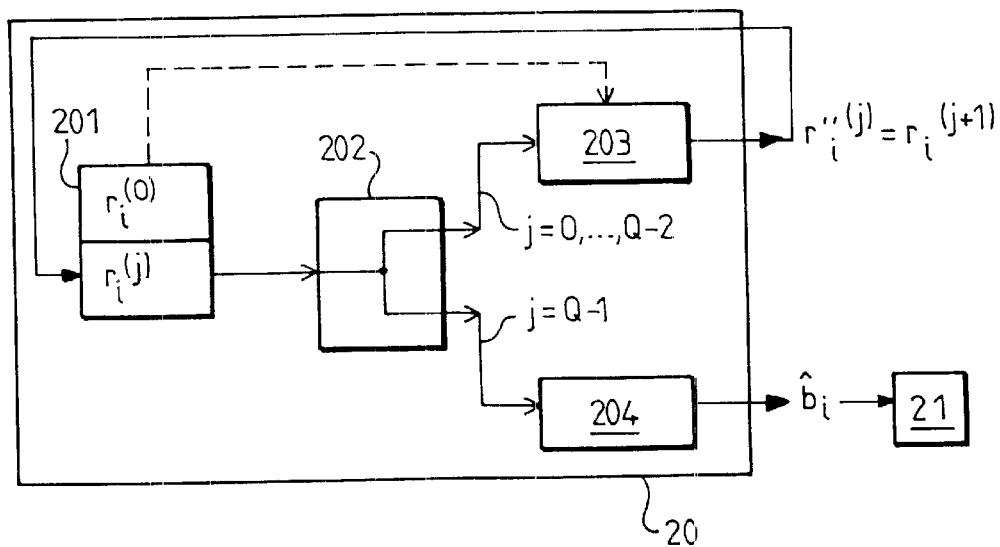
FIGS. 5 and 6 are more detailed representations of certain blocks of FIG. 4.

In FIG. 5 is shown by way of a block diagram an example of embodiment of decoding means 20 according to the invention. They comprise a memory 201 in which are stored the symbols received from the channel [$r_0^{(0)}$, . . . , $r_{N-1}^{(0)}$] and the weighted sums [$r''_0^{(j)}$, . . . , $r''_{N-1}^{(j)}$] produced with each iteration j in the form of a second recording. Each block [$r_0^{(j)}$, . . . , $r_{N-1}^{(j)}$] read from the memory 201 is applied to the input of a router 202 which addresses the input data corresponding to the Q−$1^{th}$ first iterations (j=0 to Q−2) to decoding means 203 which produce the weighted sums [$r''_0^{(j)}$, . . . , $r''_{N-1}^{(j)}$] stored in the memory 201, and the input data corresponding to the $Q^{th}$ iteration (j=Q−1) to decoding means 204 which produce hard decisions [$\hat{b}_0$, . . . , $\hat{b}_{N-1}$] which are transmitted to the extraction means 21.

Figure 6:
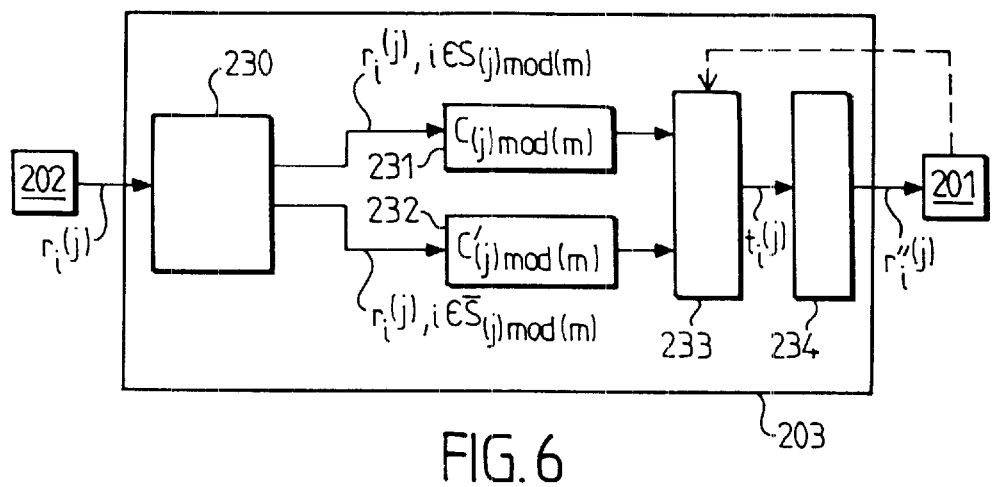

In FIG. 6 are shown in detail in the form of a block diagram decoding means 203. They comprise a demultiplexer 230 which receives, coming from a router 202, the input data [$r_0^{(j)}$, . . . , $r_{N-1}^{(j)}$] for the $j^{th}$ iteration. This demultiplexer 230 applies the data [$r_i^{(j)}$, i∈$S_{(j)mod(m)}$] to first decoding means 231 for decoding the code $C_{(j)mod(m)}$, and the data [$r_i^{(j)}$, i∈$\overline{S}_{(j)mod(m)}$] to second decoding means 232 for decoding the code $C'_{(j)mod(m)}$. At the output of the first decoding means 231 are obtained the soft decisions [$r'_i^{(j)}$, i∈$S_{(j)mod(m)}$] and at the output of the second decoding means 232 are obtained the soft decisions [$r'_i^{(j)}$, i∈$\overline{S}_{(j)mod(m)}$]. These soft decisions are applied to the input of normalization means 233. These normalization means 233 produce data $t_i^{(j)}$ which are applied to weighting means 234. The weighting means 234 further receive, coming from the memory 201, the symbols $r_i^{(0)}$ which have been received from the channel. They produce data $r''_i^{(j)}$ which form the subsequent input data $r_i^{(j+1)}$ for the next iteration and which are stored in the memory 201.

Figure 7:
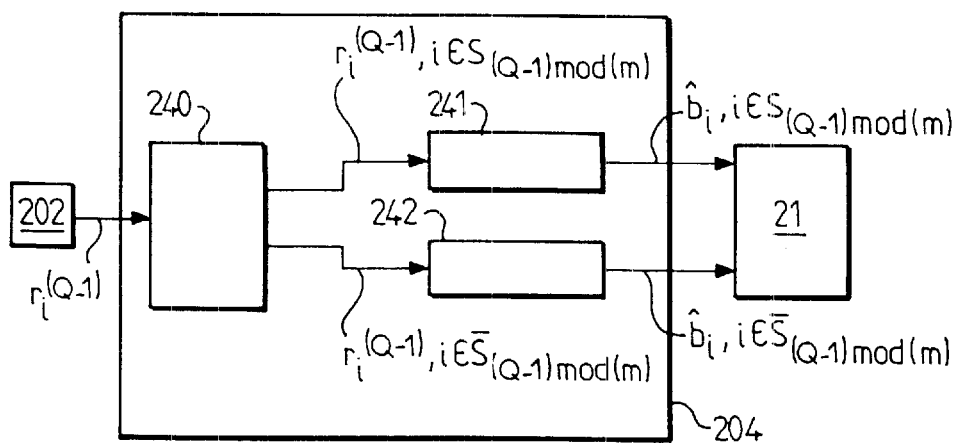
FIG. 7 is a block diagram of a decoder for a two-dimension product code of which each of the codes is an extended Hamming code.

FIG. 7 shows in detail the decoding means 204 in the form of a block diagram. Similarly to the coding means 203, they comprise a demultiplexer 240 which receives, coming from the router 202, input data [$r_0^{(Q-1)}$, . . . , $r_{N-1}^{(Q-1)}$] for the iteration Q−1. This demultiplexer 240 applies the data [$r_i^{(Q-1)}$, i∈$S_{(Q-1)mod(m)}$] to first decoding means 241 for decoding the code $C_{(Q-1)mod(m)}$, and the data [$r_i^{(Q-1)}$, i∈$\overline{S}_{(Q-1)mod(m)}$] to second decoding means 242 for decoding the code $C'_{(Q-1)mod(m)}$. At the output of the first coding means 241 are obtained the hard decisions [$\hat{b}_i$, i∈$S_{(Q-1)mod(m)}$], and at the output of the second decoding means 242 are obtained the hard decisions [$\hat{b}_i$, i∈$\overline{S}_{(Q-1)mod(m)}$]. These hard decisions are applied to the extraction means 21.

In another embodiment of the invention, the last iteration j=Q−1 produces a block of soft decisions (or of weighted sums obtained on the basis of these soft decisions). This embodiment enables to implement the decoding method that has just been described for decoding a product code for which at least one of the codes used is a binary block code (a code that may be represented by a matrix of various dimensions of which each dimension gives a code word while the codes used for each dimension may be different is called a product code). For decoding a product code, an iterative decoding is used in known fashion which consists of alternating a decoding of the matrix with each of its dimensions several times. For each of these decodings, soft decisions are to be available on the input, whence the necessity to produce a soft decision for the last iteration on the output of the decoding means according to the invention.

Figure 8:
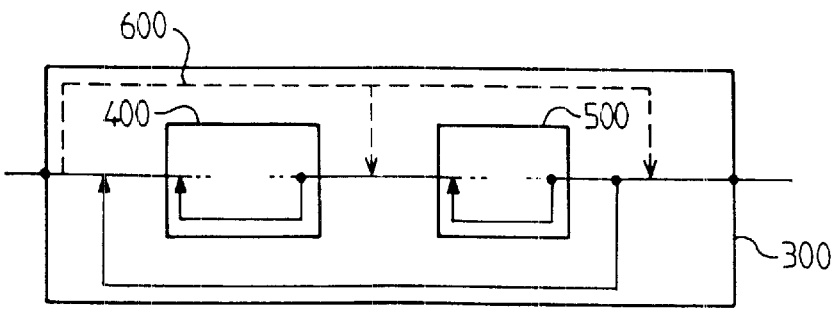
FIG. 8 is a block diagram of a decoder 300 for a two-dimension product code.

FIG. 8 diagrammatically represents an example of a decoder 300 for a two-dimension product code, of which each of the codes is an extended binary block code. This decoder 300 comprises first decoding means 400 for performing a matrix row decoding and second decoding means 500 for performing a matrix column decoding. These decoding means 400 and 500 are similar to those that have just been described, but produce soft decisions at the last iteration (with the exception of the last iteration of the decoding means 500, for the last iteration of the decoder 300).

In another embodiment, shown in the diagram by dashed arrows 600 in FIG. 8, the performance is further improved by weighting the soft decisions of the matrices produced on the output of the decoding means 400 and 500 with the symbols received from the channel.

The invention is not restricted to the embodiment that has just been described by way of example. More particularly, the normalization step 130 and weighting step 140 or one of these steps could be omitted, which would lead to a drop of the system performance.

What is claimed is:

1. A digital transmission system comprising a transmitting end data coding means (3) based on a binary block code defined by a parity check matrix, and at a receiving end decoding means (20) for making decisions on received data (10), characterized in that said decoding means are iterative decoding means, each iteration corresponding to the decoding, for received data, of the code or codes defined by a row of the matrix.

2. A digital transmission system as claimed in claim 1, characterized in that, when said binary block code is an extended code, each row of the matrix defines two separate codes ($C_{(j)mod(m)}$ and $C'_{(j)mod(m)}$), and said iterative decoding means (20) comprise means (231 and 232) for processing each of the two codes in parallel.

3. A digital transmission system as claimed in claim 1, characterized in that said decoding means comprise for the processing of certain iterations at least:

calculating means for calculating, based on input data ($r_i^{(j)}$), reliability data ($f_i^{(j)}$) relating to soft decisions ($r'_i^{(j)}$), transforming means for calculating transformed data ($t_i^{(j)}$) based on said soft decisions so as to normalize the mean value of said reliability data, weighting means for calculating weighted sums ($r''_i^{(j)}$) of said transformed data and received data ($r_i^{(j)}$) with a first ($\alpha_{(j)}$) and a second ($\delta_{(j)}$) weight factor, respectively, generating means for generating subsequent input data ($r_i^{(j+1)}$) to be re-inserted for the next iteration on the basis of said weighted sums.

4. A digital transmission system as claimed in claim 2, characterized in that said decoding means comprise for the processing of certain iterations at least:

calculating means for calculating, based on input data (ri(j)), reliability data (fi(j)) relating to soft decisions (r'i(j)), transforming means for calculating transformed data (ti(j)) based on said soft decisions so as to normalize the mean value of said reliability data, weighting means for calculating weighted sums (r"i(j)) of said transformed data and received data (ri(0)) with a first ($\alpha$(j)) and a second ($\delta$(j)) weight factor, respectively, generating means for generating subsequent input data (ri(j+1)) to be re-inserted for the next iteration on the basis of said weighted sums.

5. A method of decoding data previously coded based on a binary block code defined by a parity check matrix, characterized in that said method is an iterative decoding method which comprises for each iteration a decoding step (120), for received data, of the code or codes defined by a row of the matrix.

6. A data decoding method as claimed in claim 5, characterized in that, when said binary block code is an extended code, each row of the matrix defines two separate codes ($C_{(j)mod(m)}$ and $C'_{(j)mod(m)}$), and said decoding method processes each of the two codes in parallel.

7. A data decoding method as claimed in claim 5, characterized in that said decoding step comprises for the processing of certain iterations at least:

a calculation step (126) for calculating, based on input data, reliability data relating to soft decisions, a transforming step (130) for calculating transformed data based on said soft decisions so as to normalize the mean value of said reliability data, a weighting step (140) for calculating weighted sums of said transformed data and received data with a first and a second weight factor, respectively, a generation step for generating subsequent input data magnitudes to be re-inserted for the next iteration on the basis of said weighted sums.

8. A data decoding method as claimed in claim 6, characterized in that said decoding step comprises for the processing of certain iterations at least:

a calculation step (126) for calculating, based on input data, reliability data relating to soft decisions, a transforming step (130) for calculating transformed data based on said soft decisions so as to normalize the mean value of said reliability data, a weighting step (140) for calculating weighted sums of said transformed data and received data with a first and a second weight factor, respectively, a generation step for generating subsequent input data magnitudes to be re-inserted for the next iteration on the basis of said weighted sums.

9. A decoder of data previously coded on the basis of a binary block code defined by a parity check matrix, characterized in that it comprises an iterative decoding means (20), each iteration corresponding to the decoding, for received data, of the code or codes defined by a row of the matrix.

10. A decoder as claimed in claim 9, characterized in that, when said binary block code is an extended code, each row of the matrix defines two separate codes ($C_{(j)mod(m)}$ and $C'_{(j)mod(m)}$), and said decoding method processes each of the two codes in parallel.

11. A decoder as claimed in claim 10, characterized in that said decoding means comprise for processing certain iterations at least:

calculating means for calculating, based on input data, reliability data relating to soft decisions, transforming means for calculating transformed data based on said soft decisions so as to normalize the mean value of said reliability data, weighting means for calculating weighted sums of said transformed data and received data with a first and a second weight factor, respectively, generating means for generating subsequent input data to be re-inserted for the next iteration on the basis of said weighted sums.

12. A decoder as claimed in claim 9, characterized in that said decoding means comprise for processing certain iterations at least:

calculating means for calculating, based on input data, reliability data relating to soft decisions, transforming means for calculating transformed data based on said soft decisions so as to normalize the mean value of said reliability data, weighting means for calculating weighted sums of said transformed data and received data with a first and a second weight factor, respectively, generating means for generating subsequent input data to be re-inserted for the next iteration on the basis of said weighted sums.

* * * * *